(12) United States Patent
Katayama

(10) Patent No.: US 10,861,525 B2
(45) Date of Patent: Dec. 8, 2020

(54) NONVOLATILE STORAGE DEVICE

(71) Applicant: Toshiba Memory Corporation, Tokyo (JP)

(72) Inventor: Akira Katayama, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/286,526

(22) Filed: Feb. 26, 2019

(65) Prior Publication Data

US 2020/0090723 A1 Mar. 19, 2020

(30) Foreign Application Priority Data

Sep. 14, 2018 (JP) .................................. 2018-172412

(51) Int. Cl.
*G11C 11/00* (2006.01)
*G11C 11/16* (2006.01)

(52) U.S. Cl.
CPC ...... *G11C 11/1673* (2013.01); *G11C 11/1655* (2013.01); *G11C 11/1657* (2013.01); *G11C 11/1659* (2013.01)

(58) Field of Classification Search
CPC ............ G11C 11/1673; G11C 11/1655; G11C 11/1657; G11C 11/1659
USPC ....................................................... 365/158
See application file for complete search history.

(56) References Cited

U.S. PATENT DOCUMENTS

| | | | | |
|---|---|---|---|---|
| 7,864,564 B2 * | 1/2011 | Hidaka | ............... | G11C 11/1693 |
| | | | | 365/158 |
| 8,284,595 B2 | 10/2012 | Nebashi et al. | | |
| 8,902,629 B2 * | 12/2014 | Kawai | .................. | H01L 27/101 |
| | | | | 365/148 |
| 9,595,311 B2 * | 3/2017 | Takizawa | ............ | G11C 11/1673 |
| 9,824,736 B1 * | 11/2017 | Katayama | ........... | G11C 11/1673 |
| 9,899,081 B2 * | 2/2018 | Pyo | ....................... | G11C 11/1655 |
| 9,899,082 B2 * | 2/2018 | Katayama | ............. | G11C 11/161 |
| 9,934,834 B2 * | 4/2018 | Nakatsuka | ............ | G11C 11/161 |
| 10,141,038 B2 * | 11/2018 | Ikegami | ............... | G11C 13/004 |
| 10,410,706 B2 * | 9/2019 | Katayama | .......... | G11C 13/0023 |

(Continued)

FOREIGN PATENT DOCUMENTS

| | | |
|---|---|---|
| JP | 5288103 B2 | 5/2006 |
| JP | 2006127672 A | 5/2006 |

(Continued)

*Primary Examiner* — Viet Q Nguyen
(74) *Attorney, Agent, or Firm* — Kim & Stewart LLP

(57) ABSTRACT

A nonvolatile storage device includes a first wiring extending in a first direction, a second wiring extending in a second direction, a memory cell between the first and second wirings, a reading circuit configured to read data from the memory cell during a first and a second reading period, a writing circuit configured to write reference data into the memory cell during a writing period between the first and second reading periods, and a determination circuit configured to compare a first voltage which is based on the data read during the first reading period with a second voltage which is based on the data read during the second reading period, to determine the value of the data read during the first reading period. A current is caused to flow in the memory cell during the first reading period, the writing period, and the second reading period.

20 Claims, 7 Drawing Sheets

(56) References Cited

U.S. PATENT DOCUMENTS

| | | | |
|---|---|---|---|
| 10,453,512 B2* | 10/2019 | Katayama | G11C 11/1673 |
| 10,615,226 B2* | 4/2020 | Konno | G11C 13/0007 |
| 2006/0092734 A1 | 5/2006 | Tsuchida et al. | |
| 2006/0233018 A1* | 10/2006 | Tanizaki | G11C 11/16 |
| | | | 365/158 |
| 2007/0268737 A1* | 11/2007 | Hidaka | G11C 11/1677 |
| | | | 365/148 |
| 2008/0043519 A1* | 2/2008 | Kitagawa | G11C 11/1673 |
| | | | 365/158 |
| 2010/0027308 A1 | 2/2010 | Maejima | |
| 2013/0250654 A1* | 9/2013 | Sugimae | G11C 13/0069 |
| | | | 365/148 |
| 2017/0372791 A1 | 12/2017 | Hatsuda | |
| 2018/0005673 A1 | 1/2018 | Kim | |
| 2020/0020365 A1* | 1/2020 | Takizawa | G11C 29/00 |

FOREIGN PATENT DOCUMENTS

| | | |
|---|---|---|
| TW | 201013678 A | 4/2010 |
| TW | 201635303 A | 10/2016 |

* cited by examiner

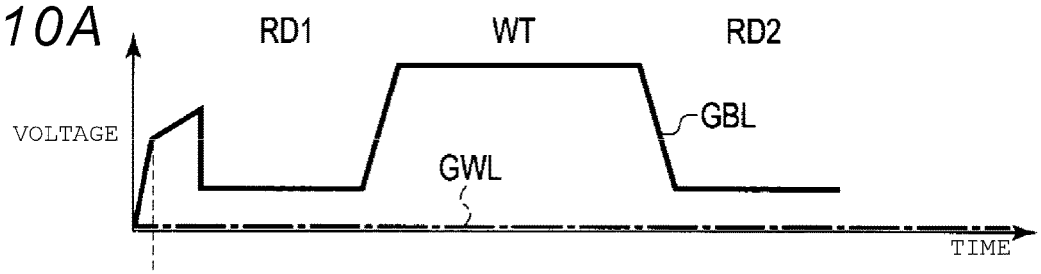
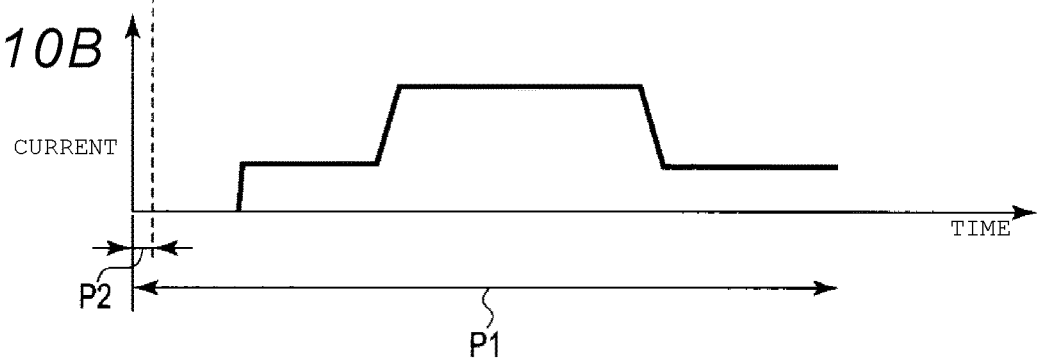

NONVOLATILE STORAGE DEVICE

CROSS-REFERENCE TO RELATED APPLICATION

This application is based upon and claims the benefit of priority from Japanese Patent Application No. 2018-172412, filed Sep. 14, 2018, the entire contents of which are incorporated herein by reference.

FIELD

Embodiments described herein relate generally to a nonvolatile storage device.

BACKGROUND

A nonvolatile storage device has been proposed, in which memory cells that each include a variable resistance storage element and a device having a switching function, which are connected in series, are arranged between word lines and bit lines. However, such nonvolatile storage device of the related art does not always perform read operation efficiently.

DESCRIPTION OF THE DRAWINGS

FIG. 10A and FIG. 10B are timing charts illustrating operation of the second configuration example of the nonvolatile storage device according to the embodiment.

DETAILED DESCRIPTION

Embodiments provide a nonvolatile storage device capable of performing an efficient read operation.

In general, according to one embodiment, a nonvolatile storage device includes a first wiring extending in a first direction, a second wiring extending in a second direction that crosses the first direction, a memory cell between the first wiring and the second wiring, a reading circuit configured to read data from the memory cell during a first reading period and during a second reading period, a writing circuit configured to write reference data into the memory cell during a writing period between the first reading period and the second reading period, and a determination circuit configured to compare a first voltage which is based on the data read during the first reading period with a second voltage which is based on the data read during the second reading period, to determine the value of the data read during the first reading period. The memory cell includes a variable resistance storage element capable of being set to a low resistance state or a high resistance according to a value of data stored in the memory cell and a two-terminal switching element by which the variable resistance storage element is selected, wherein the variable resistance storage element and the two-terminal switching element are connected in series. A current is caused to flow in the memory cell in a same direction during the first reading period, during the writing period, and during the second reading period.

Hereinafter, embodiments will be described with reference to the drawings.

Figure 1:
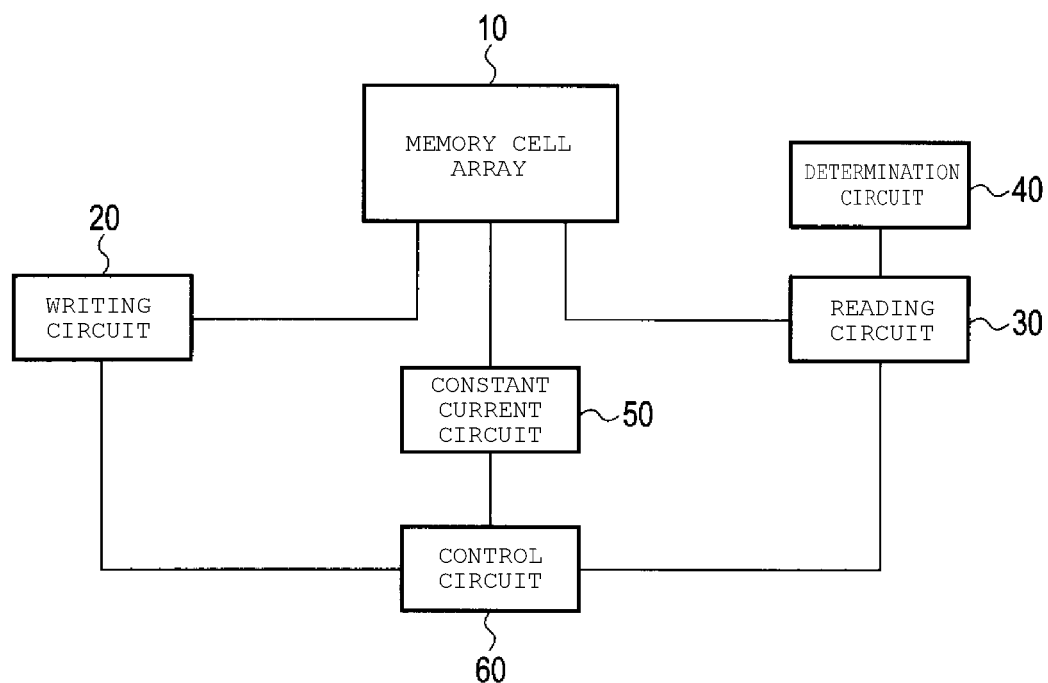
FIG. 1 is a block diagram of a nonvolatile storage device according to an embodiment.

FIG. 1 is a block diagram illustrating a schematic configuration of a nonvolatile storage device according to an embodiment.

The nonvolatile storage device illustrated in FIG. 1 includes a memory cell array 10, a writing circuit 20, a reading circuit 30, a determination circuit 40, a constant current circuit 50, and a control circuit 60.

Figure 2:
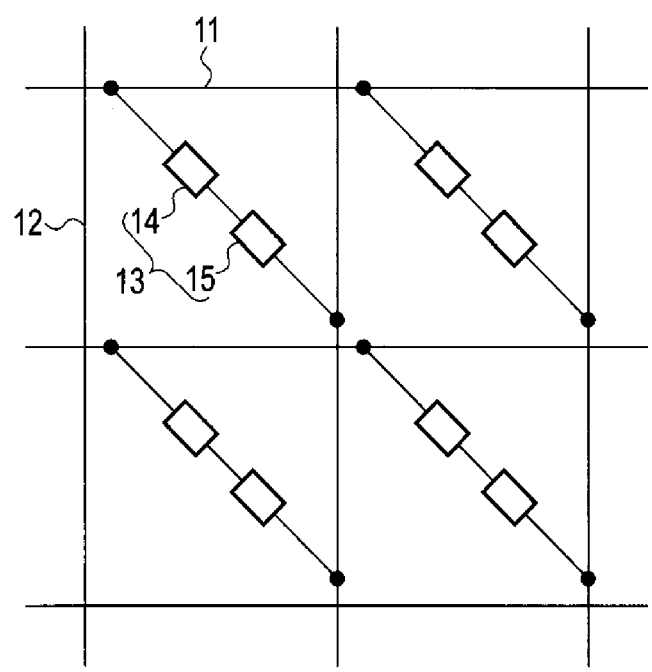
FIG. 2 is a circuit diagram of a memory cell array in the nonvolatile storage device according to the embodiment.

FIG. 2 is a circuit diagram illustrating a configuration of the memory cell array 10 in the nonvolatile storage device.

The memory cell array 10 illustrated in FIG. 2 includes a plurality of word lines 11, a plurality of bit lines 12, and a plurality of memory cells 13. The word line 11 and the bit line 12 are above a substrate at different heights above the substrate and extend in different directions that are parallel to a surface of the substrate and intersect each other, and the memory cell 13 is disposed between the word line 11 and the bit line 12 where the bit line 12 is directly above the word line 11. One end of the memory cell 13 is connected to the word line 11, and the other end of memory cell 13 is connected to bit line 12.

The memory cell 13 includes a variable resistance storage element 14 and a two-terminal selector element 15 that selects the variable resistance storage element 14, which are connected in series thereto. The memory cell array 10 is configured such memory cells 13 are arranged in an array.

The variable resistance storage element 14 can selectively set one of a low resistance state and a high resistance state having a higher resistance than the low resistance state, as data (0 or 1). For example, a magneto-resistive element, that is, a magnetic tunnel junction (MTJ) element may be used as the variable resistance storage element 14.

The magneto-resistive element 14 includes a storage layer, a reference layer, and a tunnel barrier layer between the storage layer and the reference layer. If a magnetization direction of the storage layer is parallel to a magnetization direction of the reference layer, the magneto-resistive element 14 is in a low resistance state. If the magnetization direction of the storage layer is not parallel to the magnetization direction of the reference layer, the magneto-resistive element 14 is in a high resistance state. The resistance state (e.g., the low resistance state and the high resistance state) of the magneto-resistive element 14 can be set according to the direction of a write current flowing in the magneto-resistive element 14. In addition, reading is also performed by causing a read current smaller than the write current to flow in the magneto-resistive element.

The two-terminal selector element 15 functions as a switch between the two terminals. If a voltage applied between the two terminals is lower than a threshold voltage, the switching element between the two terminals is in a high resistance state (for example, an electrically nonconductive state). If the voltage applied between the two terminals is higher than the threshold voltage, the switching element between the two terminals is in a low resistance state (for example, an electrically conductive state). The switching element between the two terminals may have the above-described function in both directions.

The switching element described above may contain at least one chalcogen element selected from the group of Te, Se and S. Alternatively, the switching element may contain chalcogenide which is a compound containing those chalcogen elements. In addition, the switching element described above may contain at least one element selected from the group of B, Al, Ga, In, C, Si, Ge, Sn, As, P and Sb.

The two-terminal selector element 15 can be turned to the low resistance state (ON state) by applying a voltage between the word line 11 and the bit line 12 to make the voltage applied between the two terminals of the two-terminal selector element 15 larger than the threshold voltage.

Figure 3:
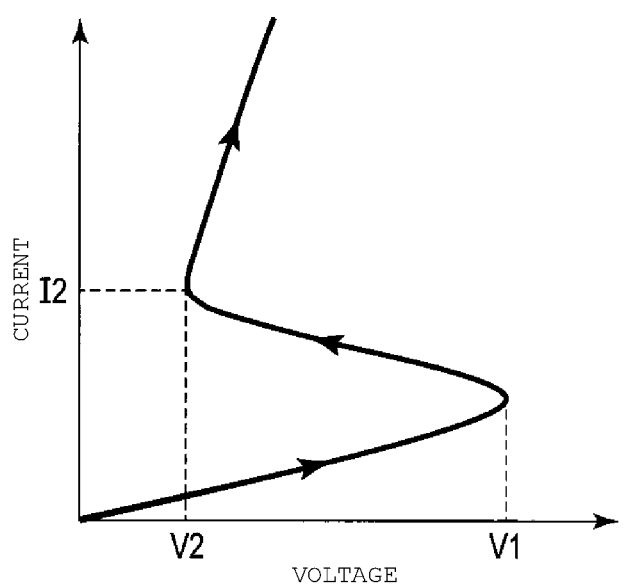
FIG. 3 is a diagram schematically illustrating voltage-current characteristics of a two-terminal selector element in the nonvolatile storage device according to the embodiment.

FIG. 3 is a diagram schematically illustrating voltage-current characteristics of the two-terminal selector element 15 in the nonvolatile storage device. When the voltage applied between the two terminals of two-terminal selector element 15 is increased and the applied voltage reaches V1, the voltage between the two terminals decreases to V2. When the applied voltage is further increased, the current rapidly increases. That is, generally speaking, according to the voltage-current characteristics of the two-terminal selector element 15, as the voltage between the two terminals increases to V1, the current monotonically increases, and when the voltage between the two terminals reaches V1, the voltage decreases to V2, and when the voltage is further increased from V2, the current monotonically increases.

The description will refer back to FIG. 1.

The writing circuit 20 is a circuit for writing the desired data to the memory cell 13 (in particular, to the variable resistance storage element 14). That is, the writing circuit 20 causes the write current to flow in the variable resistance storage element 14 via the two-terminal selector element 15, and then, the desired data (the data corresponding to low resistance state or high resistance state) is written into the variable resistance storage element 14. The writing circuit 20 includes a write driver (W/D) and the like.

The reading circuit 30 is a circuit for reading the data from the memory cell 13 (in particular, from the variable resistance storage element 14). That is, the reading circuit 30 causes the read current to flow in the variable resistance storage element 14 via the two-terminal selector element 15, and then, the data (the data corresponding to the low resistance state or the high resistance state) stored in the variable resistance storage element 14 is read out. The reading circuit 30 includes a sense amplifier (S/A) or the like.

The determination circuit 40 is a circuit for determining the data (the data corresponding to the low resistance state or the high resistance state) read by the reading circuit 30. The determination circuit 40 will be described later in detail.

The constant current circuit 50 is a circuit for supplying a constant current to the memory cell 13. The constant current circuit 50 will be described later in detail.

The control circuit 60 is a circuit for controlling the writing circuit 20, the reading circuit 30, the constant current circuit 50, and the like.

In the present embodiment, the read operation is performed by a self-reference reading method. Hereinafter, the self-reference reading method will be described.

For example, if the magneto-resistive element is used as the variable resistance storage element 14, it is difficult to increase a read margin of the variable resistance storage element 14. In particular, when the resistance value varies for each element, it becomes difficult to fix the threshold voltage to a constant value between the low resistance state and the high resistance state. It is possible to reduce such problems by using the self-reference reading method.

In the self-reference reading method, first, the data stored in the variable resistance storage element 14 is read in a first reading period. Specifically, a first voltage based on the data read in the first reading period is held. Next, in a writing period, reference data is written into the variable resistance storage element 14. Specifically, the data corresponding to the low resistance state or the data corresponding to the high resistance state is written into the variable resistance storage element 14 as the reference data. Subsequently, in a second reading period, the data based on the reference data written in the writing period is read from the variable resistance storage element 14. Specifically, a second voltage based on the data read in the second reading period is read out. The data read in the first reading period is determined by comparing the first voltage with the second voltage. That is, it is determined whether the data read in the first reading period is the data corresponding to the low resistance state or the data corresponding to the high resistance state by comparing the first voltage with the second voltage. The determination operation is performed by the determination circuit 40.

For example, it is assumed that the data corresponding to the low resistance state is used as the reference data. In this case, if there is almost no difference between the first voltage and the second voltage, the data read in the first reading period (the data that was originally stored) is determined to be the data corresponding to the low resistance state. If the difference between the first voltage and the second voltage is large, the data read in the first reading period (the data that was originally stored) is determined to be the data corresponding to the high resistance state. In order to further improve the reading accuracy, it is preferable to use an offset voltage described later.

By using the self-reference reading method as described above, even if the resistance value varies for each element, it is possible to reliably read the data stored in the variable resistance storage element 14 (the data that was originally stored).

In the present embodiment, in the above-described self-reference reading method, the directions of the currents flowing in the memory cell 13 during the first reading period, during the writing period, and during the second reading period are the same. That is, the control circuit 60 controls the writing circuit 20 and the reading circuit 30 such that a current flows in the memory cell 13 in the same direction during the first reading period, during the writing period, and during the second reading period. This point will be further described below.

As described above, the two-terminal selector element 15 has the voltage-current characteristics as illustrated in FIG. 3. That is, once the two-terminal selector element 15 is in an OFF state, the two-terminal selector element 15 will not be in the ON state again unless a voltage is applied to reach the voltage V1 in FIG. 3. Therefore, when the direction of the current flowing in the memory cell 13 is changed in the reading period and the writing period, once the two-terminal selector element 15 is in the OFF state in the period between the reading period and the writing period, it is necessary to shift the state of the two-terminal selector element 15 to the ON state. Therefore, it becomes difficult to perform the efficient self-reference read operation.

Since the current flows in the variable resistance storage element 14 in the same direction during the first reading period, during the writing period, and during the second reading period, it is possible to prevent the problems described above and to perform the efficient read operation.

Furthermore, in the present embodiment, it is possible to more effectively prevent the problems described above by providing the constant current circuit 50.

Even if the current flows in the variable resistance storage element 14 in the same direction during the first reading period, during the writing period, and during the second reading period, if there exists a period during which no current flows in the memory cell 13 between the reading period and the writing period, there is a problem in that the two-terminal selector element 15 may be in the OFF state during such a period.

In the present embodiment, by providing a constant current circuit 50, the current can be continuously supplied to the variable resistance storage element 14 during the first reading period, during the writing period, and during the second reading period. Therefore, it is possible to prevent the above-described problem and to perform the more efficient read operation.

Next, more detailed configuration example and more detailed operation of the nonvolatile storage device according to the present embodiment will be described with reference to the circuit diagram of FIG. 4 and the timing diagram of FIG. 5.

Figure 4:
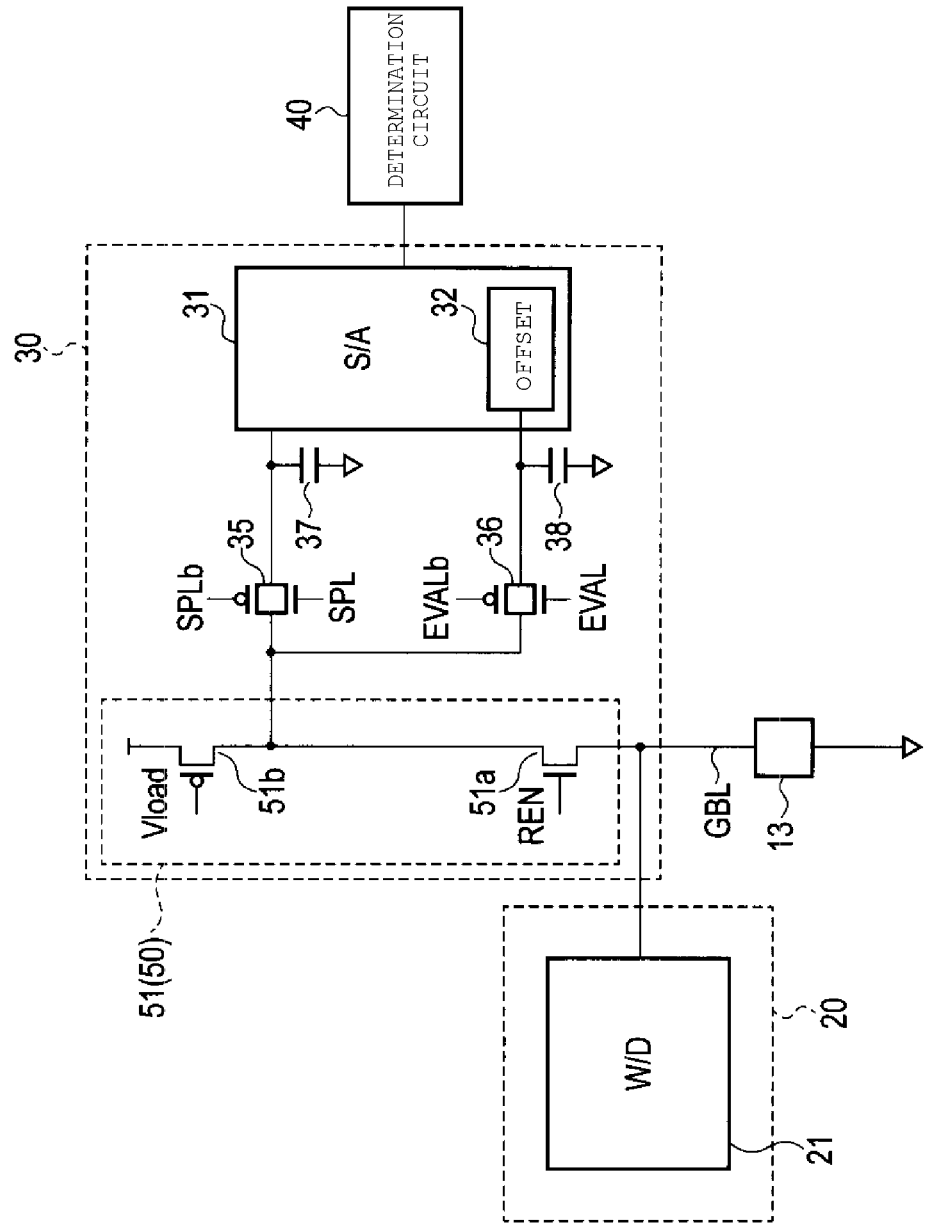
FIG. 4 is a circuit diagram illustrating a first configuration example of the nonvolatile storage device according to the embodiment.

As illustrated in FIG. 4, the writing circuit 20 includes a write driver (W/D) 21, and writing is performed by the W/D 21.

The reading circuit 30 includes a sense amplifier (S/A) circuit 31. The S/A circuit 31 includes an S/A main circuit and an offset circuit 32. The reading circuit 30 also includes a constant current source 51. That is, the constant current source in the constant current circuit 50 illustrated in FIG. 1 is substantially the constant current source 51 for the reading circuit 30. The constant current source 51 includes a transistor 51a and a transistor 51b. In addition, the memory cell 13 is connected to the constant current source 51 via a global bit line GBL. Furthermore, the reading circuit 30 includes a transistor pair 35, a transistor pair 36, a capacitor 37, and a capacitor 38.

Figure 5:
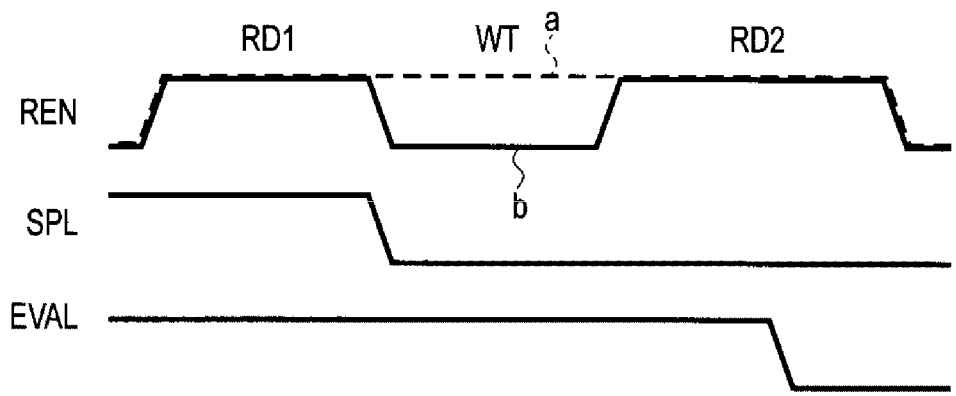
FIG. 5 is a timing chart illustrating an operation of the first configuration example of the nonvolatile storage device according to the embodiment.

As illustrated in FIG. 5, in a first reading period RD1, a REN signal is at a high level, and the transistor 51a is in the ON state. In addition, since an SPL signal and an EVAL signal are also at a high level, the transistor pair 35 and the transistor pair 36 are also in the ON state. As a result, the data of the memory cell 13 (the data of the variable resistance storage element) is read via the transistor 51a, the transistor pair 35 and the transistor pair 36, and the voltage corresponding to the data of the memory cell 13 is charged in the capacitor 37 and the capacitor 38.

During the writing period WT, the reference data (0 or 1) is written into the variable resistance storage element in the memory cell 13 from the write driver 21. In addition, since the SPL signal is switched to the low level, the transistor pair 35 is in the OFF state. Therefore, the charging voltage is held in the capacitor 37. In the present embodiment, during the writing period WT, the REN signal (a) is maintained to be at the high level, and the transistor 51a is maintained to be in the ON state. For this reason, the current continuously flows in the memory cell 13 during the first reading period RD1 and the writing period WT. Therefore, as described above, the two-terminal selector element in the memory cell 13 is maintained to be in the ON state without being in the OFF state. In contrast, in the case of the comparison example, since the REN signal (b) is switched to the low level, the transistor 51a is in the OFF state. Therefore, no current flows in the memory cell 13, and the two-terminal selector element in the memory cell 13 is in the OFF state.

During the second reading period RD2, the REN signal is maintained to be at the high level. During the first half of the second reading period RD2, since the EVAL signal is at the high level, the capacitor 38 is charged with the voltage through the transistor pair 36. That is, the voltage corresponding to the reference data is charged in the capacitor 38. During the second half of the second reading period RD2, since the EVAL signal is at the low level, the charging voltage is held in the capacitor 38. During the second reading period RD2, since the REN signal is maintained to be at the high level, the current continues to flow during the writing period WT and the second reading period RD2. Therefore, as described above, the two-terminal selector element in the memory cell 13 is maintained to be in the ON state without being in the ON state.

Figure 6A:
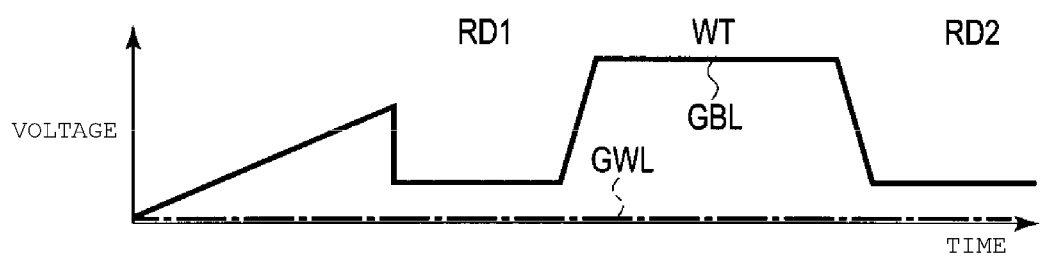
FIG. 6A and FIG. 6B are timing charts illustrating the operation of the first configuration example of the nonvolatile storage device according to the embodiment.
Figure 6B:
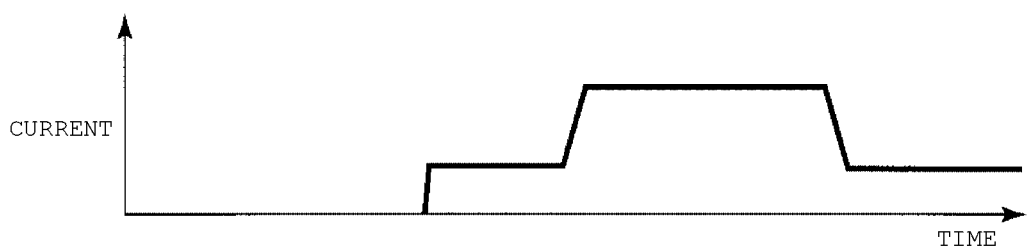

FIG. 6A is a timing chart illustrating the voltages at the global bit line GBL and at the global word line GWL, and FIG. 6B is a timing chart illustrating the current flowing in the memory cell 13. As can be seen from FIG. 6A and FIG. 6B, the voltage is continuously applied to the memory cell 13 during the first reading period RD1, during the writing period WT, and during the second reading period RD2, and the current flows in the memory cell 13.

The determination circuit 40 compares the voltage (referred to as a voltage Va) held in the capacitor 37 with the voltage (referred to as a voltage Vb) held in the capacitor 38. At this time, instead of simply comparing the voltage Va and the voltage Vb, an offset voltage generated by the offset circuit 32 is added to one of the voltage Va and the voltage Vb. Hereinafter, a function of the offset circuit 32 will be described.

For example, it is assumed that low level data is used as the reference data (data corresponding to the voltage Vb). In this case, if there is almost no difference between the voltage Va and the voltage Vb, the data read during the first reading period (the data that was originally stored) is determined to be the low level data. If the difference between the voltage Va and the voltage Vb is large, the data read during the first reading period (the data that was originally stored) is determined to be a high level data. However, the normal determination operation compares the voltage level of the originally stored data (referred to as a voltage level Vx) with the voltage level of the reference data (referred to as a voltage level Vy) to determine whether Vx>Vy or Vx<Vy. Thus, accurate determination operation may be difficult to achieve by a simple comparison between the voltages Va and Vb. Therefore, in the present embodiment, the offset voltage is added to one of the voltage Va and the voltage Vb.

Figure 7:
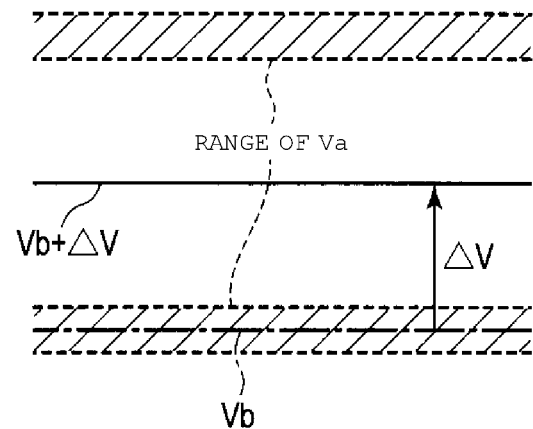
FIG. 7 is a diagram illustrating a function of an offset circuit of the nonvolatile storage device according to the embodiment.
Figure 8:
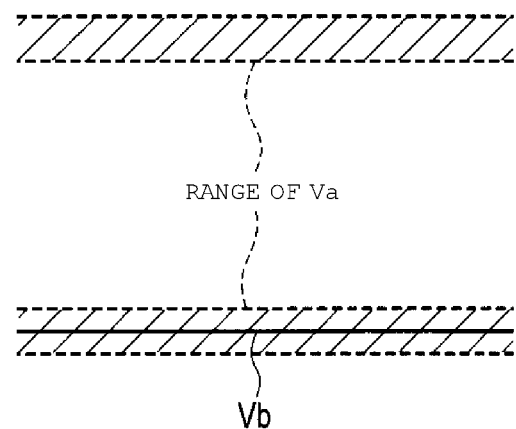
FIG. 8 is a diagram illustrating a comparison example of FIG. 7.

FIG. 7 and FIG. 8 are diagrams illustrating functions of the offset circuit 32 described above. FIG. 7 illustrates a case where the offset circuit 32 is provided (a case in the present embodiment), and FIG. 8 illustrates a case where the offset circuit 32 is not provided (in the case of the comparison example).

In the comparison example in FIG. 8, if the data read during the first reading period is the low level data, ideally the voltage Va and the voltage Vb are equal to each other. However, in reality, the voltage Va may be a voltage slightly higher than the voltage Vb, or the voltage Va may be a voltage slightly lower than the voltage Vb. Therefore, in the method of comparison example, there is a possibility that the data read during the first reading period (the data that was originally stored) cannot be accurately determined.

In the example according to the present embodiment illustrated in FIG. 7, the offset voltage ΔV is added to the voltage Vb, and Vb+ΔV is set as a reference voltage (threshold voltage). If the voltage Va is determined with reference to this reference voltage (the threshold voltage) Vb+ΔV, it is possible to reliably determine whether the data read during the first reading period (the data that was originally stored) is the low level data or the high level data.

In the example described above, the offset voltage ΔV is added to the voltage Vb (the voltage corresponding to the reference data). The offset voltage ΔV may be added to the voltage Va (the voltage corresponding to the data that was originally stored). That is, in the example described above, the offset voltage ΔV is added to the voltage Vb read from the memory cell 13 during the second reading period. However, the offset voltage ΔV may be added to the voltage Va read from the memory cell 13 during the first reading period.

Figure 9:
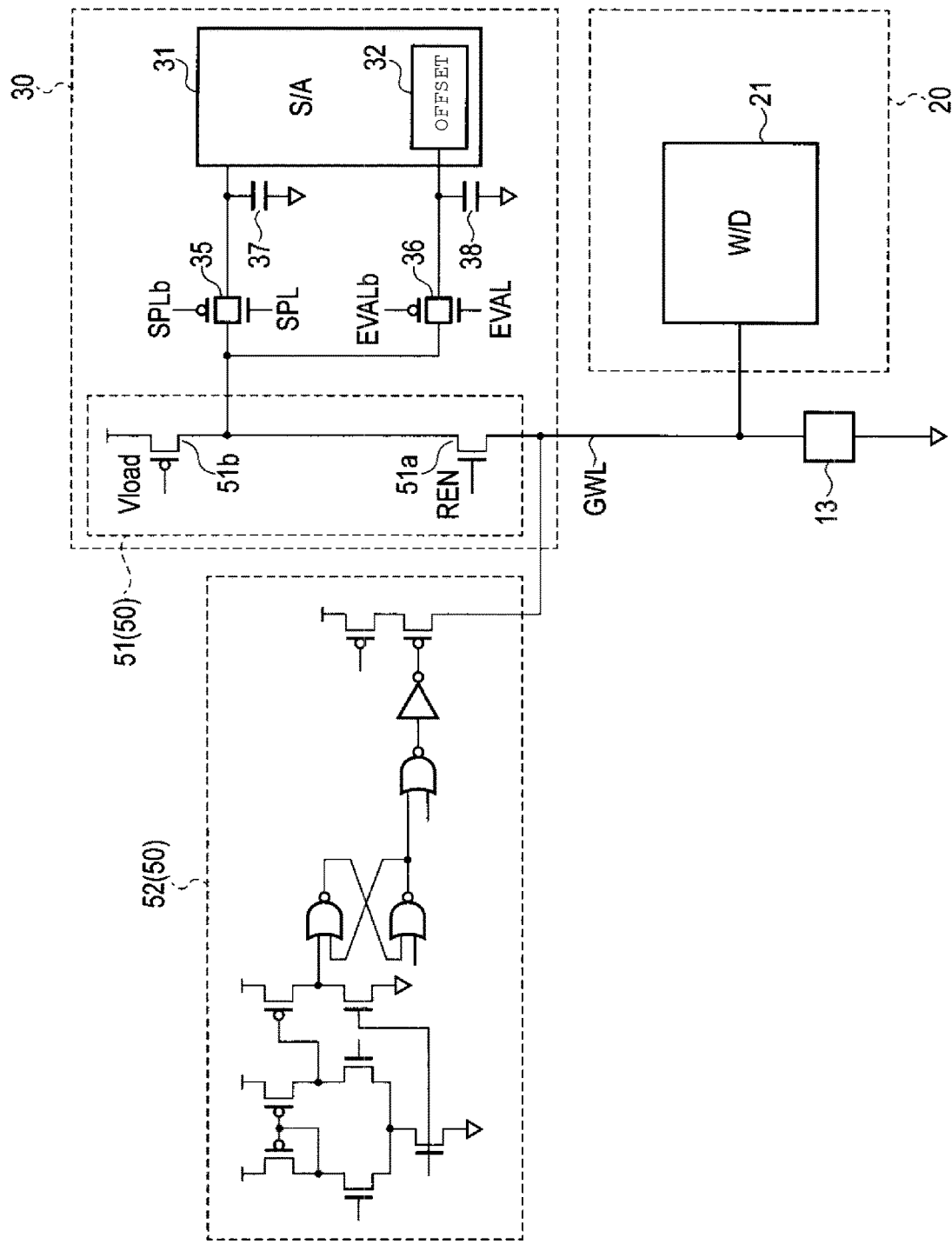
FIG. 9 is a circuit diagram illustrating a second configuration example of the nonvolatile storage device according to the embodiment.

Next, a modification example (a second configuration example) of the nonvolatile storage device according to the present embodiment will be described with reference to the circuit diagram of FIG. 9 and the timing chart of FIG. 10.

In the first configuration example illustrated in FIG. 4, the constant current circuit 50 includes only one constant current source 51. However, in the second configuration example, as illustrated in FIG. 9, the constant current circuit 50 includes two constant current sources 51 and 52. In this configuration example, the basic configuration other than the second constant current source 52 is the same as the first configuration example.

FIG. 10A is a timing chart illustrating the voltages at the global bit line GBL and the global word line GWL, and FIG. 10B is a timing chart illustrating the current flowing in the memory cell 13. A period P1 is a period in which the first constant current source 51 is ON and a period P2 is a period in which the second constant current source 52 is ON.

As can be seen from FIG. 10A and FIG. 10B, similarly to the first configuration example, the voltage is continuously applied to the memory cell 13 during the first reading period RD1, during the writing period WT and during the second reading period RD2, and the current flows in the memory cell 13.

In this configuration example, the second constant current source 52 that supplies a current to the memory cell 13 is in the ON state only during beginning of the first reading period RD1. By providing this second constant current source 52, the two-terminal selector element can be quickly transitioned to the ON state at the beginning of the first reading period RD1, and thus, it is possible to speed up the operation of the self-reference reading method.

In addition, in each of the embodiments described above, the case where the switching element between the two terminals is applied as a selector is described. However, a select transistor such as a metal oxide semiconductor (MOS) transistor or a FIN transistor including a field effect transistor which is a switching element between three terminals may be applied as a selector. In addition, a switching element having a two-terminal diode function may be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile storage device comprising:
   a first wiring extending in a first direction;
   a second wiring extending in a second direction that crosses the first direction;
   a memory cell between the first wiring and the second wiring, the memory cell including a variable resistance storage element capable of being set to a low resistance state or a high resistance according to a value of data stored in the memory cell and a two-terminal switching element by which the variable resistance storage element is selected, wherein the variable resistance storage element and the two-terminal switching element are connected in series;
   a reading circuit configured to read data from the memory cell during a first reading period and during a second reading period;
   a writing circuit configured to write a reference data into the memory cell during a writing period between the first reading period and the second reading period; and
   a determination circuit configured to compare a first voltage which is based on the data read during the first reading period with a second voltage which is based on the data read during the second reading period, to determine the value of the data read during the first reading period,
   wherein a current is caused to flow in the memory cell in a same direction during the first reading period, during the writing period, and during the second reading period.

2. The nonvolatile storage device according to claim 1, further comprising:
   a first constant current source that continuously supplies a current to the memory cell during the first reading period, during the writing period, and during the second reading period.

3. The nonvolatile storage device according to claim 2, wherein the first constant current source is provided in the reading circuit.

4. The nonvolatile storage device according to claim 2, further comprising:
   a second constant current source that supplies a current to the memory cell at the beginning of the first reading period.

5. The nonvolatile storage device according to claim 1, wherein the first voltage is a voltage obtained by adding an offset voltage to a voltage corresponding to the data read from the memory cell during the first reading period.

6. The nonvolatile storage device according to claim 1, wherein the second voltage is a voltage obtained by adding an offset voltage to a voltage corresponding to the data read from the memory cell during the second reading period.

7. The nonvolatile storage device according to claim 1, wherein the two-terminal switching element is in a low resistance state when a voltage applied between the two terminals is higher than a threshold voltage and is in a high resistance state when a voltage applied between the two terminals is lower than the threshold voltage.

8. The nonvolatile storage device according to claim 1, wherein the two-terminal switching element contains a chalcogen element.

9. The nonvolatile storage device according to claim 1, wherein the variable resistance storage element is a magneto-resistive element.

10. A nonvolatile storage device comprising:
a first wiring extending in a first direction;
a second wiring extending in a second direction that crosses the first direction;
a memory cell between the first wiring and the second wiring, the memory cell including a variable resistance storage element having a first end connected to the first wiring, and a switching element having a first end connected to a second end of the variable resistance storage element and a second end connected to the second wiring;
a reading circuit configured to charge at least one of a first capacitor and a second capacitor with a voltage corresponding to a value of data written into the memory cell;
a writing circuit configured to set the variable resistance storage element to a low resistance state or a high resistance state in accordance with a value of data to be written into the memory cell; and
a control circuit configured to perform a read operation by controlling the reading circuit and the writing circuit to perform a first read operation, a write operation, and a second read operation in succession, wherein
during the first read operation, the write operation, and the second read operation, the control circuit causes a current to continuously flow in the memory cell in a same direction.

11. The nonvolatile storage device according to claim 10, wherein the reading circuit includes a constant current source connected to the memory cell through a transistor, and the transistor is maintained in an ON state during the first read operation, the write operation, and the second read operation.

12. The nonvolatile storage device according to claim 11, further comprising:
an additional constant current source connected to the memory cell, wherein the additional constant current source is turned ON at a beginning of the first read operation.

13. The nonvolatile storage device according to claim 10, further comprising:
a determination circuit configured to compare a first voltage which is based on the data read during the first read operation with a second voltage which is based on the data read during the second read operation, to determine the value of the data read during the first read operation.

14. The nonvolatile storage device according to claim 13, wherein the first voltage is a voltage obtained by adding an offset voltage to a voltage corresponding to the data read from the memory cell during the first read operation.

15. The nonvolatile storage device according to claim 13, wherein the second voltage is a voltage obtained by adding an offset voltage to a voltage corresponding to the data read from the memory cell during the second read operation.

16. The nonvolatile storage device according to claim 10, wherein the switching element is in a low resistance state when a voltage applied across the switching element is higher than a threshold voltage and is in a high resistance state when a voltage applied across the switching element is lower than the threshold voltage.

17. The nonvolatile storage device according to claim 16, wherein the switching element contains a chalcogen element.

18. The nonvolatile storage device according to claim 10, wherein the variable resistance storage element is a magneto-resistive element.

19. A method of performing a read operation on a memory cell including a variable resistance storage element having a first end connected to a first wiring, and a switching element having a first end connected to a second end of the variable resistance storage element and a second end connected to a second wiring, said method comprising:
during a first period of the read operation, charging a first capacitor with a voltage corresponding to a value of data written into the memory cell;
during a second period of the read operation following the first period, setting the variable resistance storage element to a low resistance state or a high resistance state in accordance with a value of a reference data to be written into the memory cell;
during a third period of the read operation following the second period, charging a second capacitor with a voltage corresponding to the value of the reference data written into the memory cell; and
comparing a first voltage which is based on the voltage charged in the first capacitor and a second voltage which is based on the voltage charged in the second capacitor, to determine the value of the data read during the first period,
wherein, during the first period, the second period, and the third period, the memory cell is continuously supplied with a current.

20. The method of claim 19, wherein an offset voltage is either added to the voltage charged in the first capacitor to obtain the first voltage or to the voltage charged in the second capacitor to obtain the second voltage.

* * * * *